United States Patent
Chang et al.

(10) Patent No.: US 7,126,150 B2
(45) Date of Patent: Oct. 24, 2006

(54) LIGHT EMITTING LAYER AND FORMING METHOD OF THE SAME

(75) Inventors: Ting-Chang Chang, Hsin-Chu (TW); Po-Tsun Liu, Hsin-Chu (TW)

(73) Assignee: United Microelectronics Corp.(TW)

( * ) Notice: Subject to any disclaimer, the term of this patent is extended or adjusted under 35 U.S.C. 154(b) by 49 days.

(21) Appl. No.: 10/925,957

(22) Filed: Aug. 26, 2004

(65) Prior Publication Data
US 2005/0042783 A1    Feb. 24, 2005

Related U.S. Application Data

(62) Division of application No. 10/441,189, filed on May 20, 2003.

(51) Int. Cl.
*H01L 29/06* (2006.01)
(52) U.S. Cl. .............. 257/9; 257/14; 257/24; 257/E33.001
(58) Field of Classification Search .......... 257/9, 257/12, 13, 14, 18, 19, 20, 24
See application file for complete search history.

(56) References Cited

U.S. PATENT DOCUMENTS 6,424,004 B1 *   7/2002   Kim et al. ............... 257/321
6,656,792 B1 *  12/2003   Choi et al. .............. 257/315

* cited by examiner

*Primary Examiner*—Kevin M. Picardat

(57) ABSTRACT

A light emitting layer including a quantum structure and the forming method of forming the same is provided. The forming method includes several steps. At first, a compound dielectric layer forms, including a dielectric layer and an impure dielectric layer, which comprises major elements and impurities. The compound dielectric layer is treated to drive the impurities to form the quantum structure in the dielectric layer according to the difference in characteristic between the major elements and impurities. For example, oxidizing the major elements to drive the impurities of the impure dielectric layer to form the quantum structure inside the dielectric layer, because the oxidizing capability of the major elements is stronger than that of the impurities. The quantum structure and compound dielectric layer construct the light emitting layer.

8 Claims, 3 Drawing Sheets ically, to a forming method and a structure of a
LIGHT EMITTING LAYER AND FORMING METHOD OF THE SAME This application is a divisional of U.S. patent application Ser. No. 10/441,189 filed May 20, 2003.

BACKGROUND OF THE INVENTION

1. Field of the Invention

The present invention relates to a light emitting layer, and more particularly, to a forming method and a structure of a light emitting layer that includes a quantum structure.

2. Description of the Prior Art

The plane displays with whole colors and high brightness are the important future product in the photo-electric property under the image requirement of people. The light emitting component that emits light efficiently, i.e. the LED based on Si composition, is the best choice in the future of the light source of the plane display. For developing the whole color light sources, some investigators suggest to increase the emitting efficiency of light emitting layers due to the. Quantum Confinement Effects by constructing porous Si and nanocrystalline Si from monocrystalline silicon. The nano-structure of the light emitting layers may be constructed from [top to down], i.e. Mechanical Milling, etched by etchant, or piling up atoms or molecules, or be constructed form [bottom to up], i.e. Gas Phase Condensation (GPC), Molecular Beam Epitaxy, or Combustion Flame-Chemical Vapor Condensation (CF-CVC). The prior methods of forming nano-structure of light emitting layers include some disadvantages, i.e. irregular quantum structure, lower producing efficiency, or additional, hard operating, and expensive devices yet.

So that it is necessary to improve the disadvantages of a quantum structure of light emitting layers in the prior art.

SUMMARY OF THE INVENTION

According to the above description of the background of the invention, it is one objective of the present invention to provide a forming method and a structure of a light emitting layer that is formed by original devices without buying or using any new devices.

It is an another objective of the present invention to provide a forming method and a structure that decides the wavelength of the light of a light emitting layer by controlling the quantum structure in dimension.

It is a further objective of the present invention to provide a simple forming method to form a light emitting layer that includes the quantum structure.

It is a further objective of the present invention to provide a forming method and a structure that decides the intensity of the light of a light emitting layer by controlling the density of the quantum structure.

It is a further objective of the present invention to provide a forming method and a structure of a light emitting layer that emits light efficaciously.

It is a further objective of the present invention to provide a forming method and a structure of a light emitting layer that emits light with low operating voltage.

The present invention provides a forming method and a structure of a light emitting layer including quantum structure. The forming method includes several steps. At first, forming a compound dielectric layer on a semiconductor substrate. The compound dielectric layer includes a dielectric layer and an impure dielectric layer, which comprises major elements and impurities. Treating the compound dielectric layer to drive the impurities to form the quantum structure in the dielectric layer according to the difference in characteristic between the major elements and impurities. For example, oxidizing the major elements to drive the impurities of the impure dielectric layer to form the quantum structure inside the dielectric layer because the oxidizing capability of the major elements is stronger than that of the impurities. After forming the quantum structure, the light emitting layer is formed. Afterward forming an up electrode and a down electrode by the prior technique to be a whole light emitting component.

All these advantageous features as well as others that are obvious from the following detailed description of preferred embodiments of the invention are obtained.

DESCRIPTION OF THE PREFERRED EMBODIMENT

In the present disclosure, the words "a" or "an" are to be taken to include both the singular and the plural. Conversely, any reference to plural items shall, where appropriate, include the singular.

The preferred embodiments of the present invention that provides a forming method and a structure of a light emitting layer included a quantum structure to improve the disadvantages in the prior art.

The present invention provides a forming method and a structure of a light emitting layer including quantum structure as the following steps. At first, providing a semiconductor substrate, and then forming a compound dielectric layer on an up surface of the semiconductor substrate. The compound dielectric layer includes a dielectric layer and an impure dielectric layer, which comprises major elements and impurities. Treating the compound dielectric layer to drive the impurities to form the quantum structure in the dielectric layer according to the difference in characteristic between the major elements and impurities. For example, oxidizing the major elements to drive the impurities of the impure dielectric layer to form the quantum structure inside the dielectric layer because the oxidizing capability of the major elements is stronger than that of the impurities. After forming the quantum structure, the light emitting layer is formed. Afterward forming an up electrode on the compound dielectric layer and a down electrode on a down surface of the semiconductor substrate.

Figure 1A:
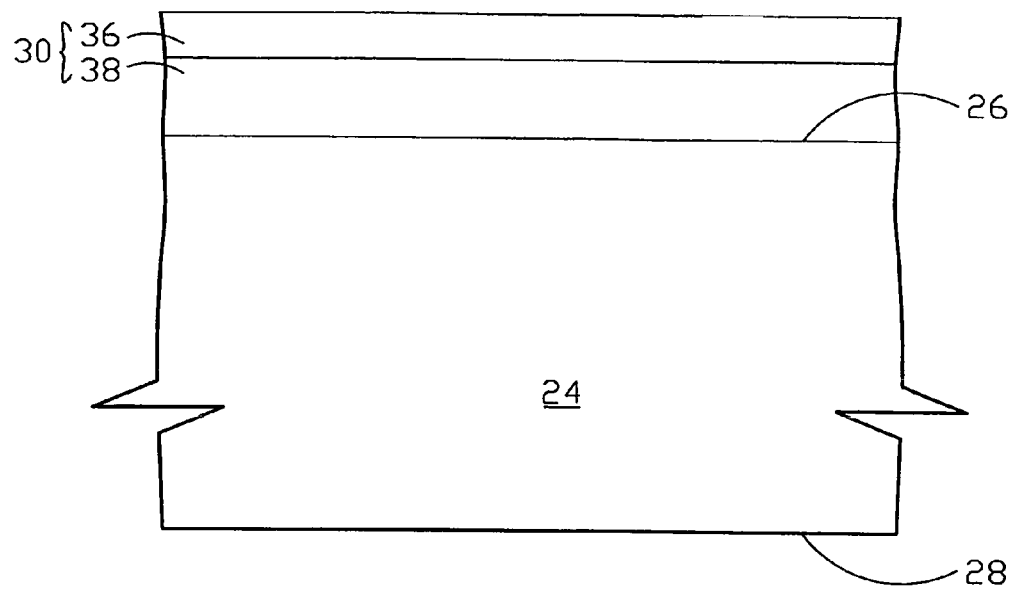
FIG. 1a and FIG. 1b are the flow diagrams of the first embodiment.

As shown in FIG. 1a, the first embodiment in the present invention is provided. Forming a dielectric layer 38, that is a silica layer, on the semiconductor substrate 24. Forming the impure dielectric layer 36 that has a plurality of major elements (not shown) and a plurality of impurities (not shown) contained on the dielectric layer 38. The dielectric layer 38 is disposed between the impure dielectric layer 36 and the semiconductor substrate 24. The dielectric layer 38 and the impure dielectric layer 36 constitute a compound dielectric layer 30.

Figure 1B:
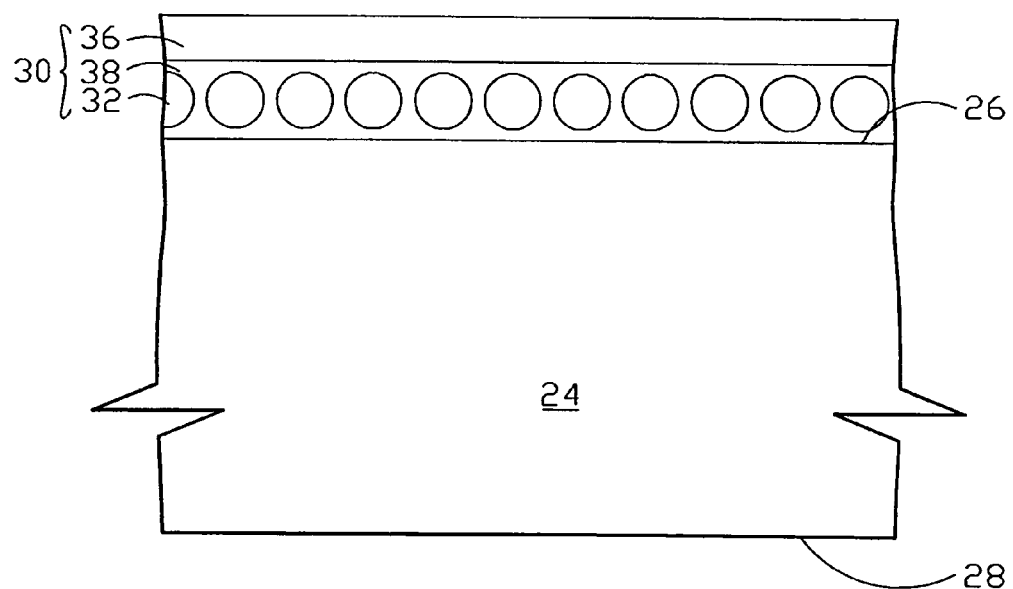

Treating the compound dielectric layer 30 to form a quantum structure such as a plurality of quantum dots 32, as shown in FIG. 1b, after the compound dielectric layer 30 was formed on the semiconductor substrate 24.

The impure dielectric layer 36 comprising the major elements, that are Si atoms, and the impurities, that are Ge atoms, in this embodiment. The oxidizing capability of the major elements is stronger than that of the impurities of the impure dielectric layer 36, which means the oxidizing capability of Si atoms is stronger than that of Ge atoms. The impure dielectric layer 36 is a SiGe layer (silicon-germanium layer) in the first embodiment, and is formed by UHVCVD(Ultra High Vacuum Chemical Vapor Deposition) with two kinds of gases—SiH$_4$ and GeH$_4$, according to the chemical formula (1)

   (1)

After forming the impure dielectric layer 36 on the dielectric layer 38, treating the impure dielectric layer 36 to oxidize the Si atoms in an environment being full of oxygen to drive the Ge atoms of the impure dielectric layer 36 to form the quantum structure. The Ge atoms are drove into the dielectric layer 38 to form the quantum dots because overwhelming majority of the Si atoms oxidizing but overwhelming majority of the Ge atoms, that having weaker oxidizing capability, non-oxidizing.

Forming an up electrode on the compound dielectric layer 30 and a down electrode on the down surface 28 of the semiconductor substrate 24 to form a whole light emitting layer by the prior technique after the quantum structure—the quantum dots 32 was formed.

The compound dielectric layer 30 was constructed by the dielectric layer 38 and the impure dielectric layer 36 before forming the quantum dots 32, and is constructed by the dielectric layer 38, the impure dielectric layer 36 and the quantum dots 32 after forming the quantum dots 32. Every quantum dot 32, which is formed by Ge.

Because every quantum dot 32 is within the nanometer (nm) scale in dimension, approximately between 1 nm and 20 nm, the density of state of each quantum dot 32 changes as well as changing in dimension of the quantum dot 32 due to the Quantum Confinement Effects. Changing the quantum dot 32 in dimension controls the qualities, e.g. light quality, electric quality and the magnetic quality, of the quantum dot 32. For example, density of state of the quantum dots 32 reduces and separates as well as the quantum dots 32 becomes smaller in dimension, so that the energy gap increases to shorten the wavelength of the emitted light. In one word, the dimension of the quantum dots 32 decides the wavelength of the emitted light. The distribution of density of the quantum dots 32 of the compound dielectric layer 32 decides the intensity of the emitted light. The higher distribution of density of the quantum dots 32 of the compound dielectric layer 32, the higher luminous intensity of emitted light is. Of course, controlling the amount of the impurities in the impure dielectric layer 36 to control the quantum dots 32 in dimension and the distribution of density of the quantum dots 32 is a way for procuring different purposes. As discussed above, the present invention provides a simple forming method of forming a light emitting layer with a quantum structure by original devices without buying or using any new devices according to the difference in characteristic, e.g. the oxidizing capability, between the major elements and impurities.

Figure 2A:
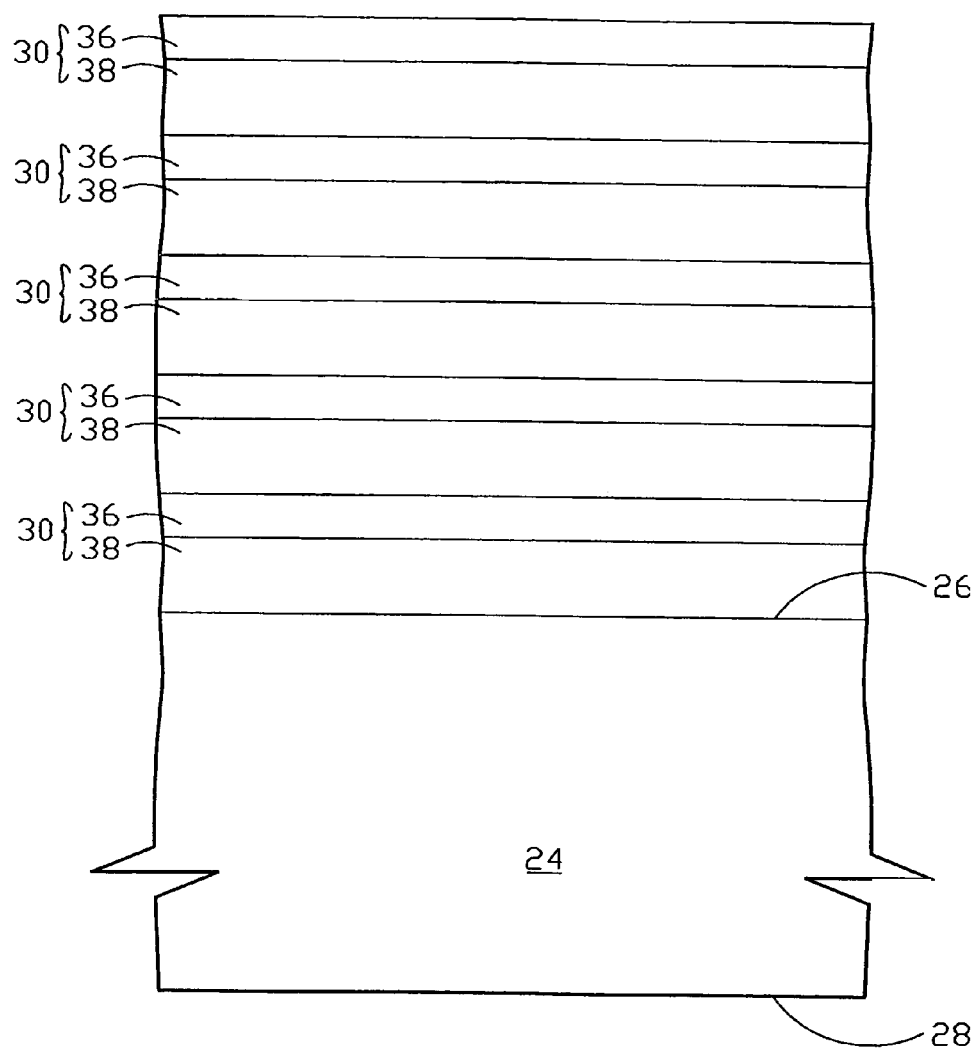
FIG. 2a and FIG. 2b are the flow diagrams of the second embodiment.

As shown in FIG. 2a, the second embodiment in the present invention is provided. Forming a dielectric layer 38, that is a silica layer, on the semiconductor substrate 24. The impure dielectric layer 36, preferred to be a SiGeO$_2$ layer that includes O$_2$, Si atoms (major elements) and Ge atoms (impurities), is formed on the semiconductor substrate 24. The dielectric layer 38 is disposed between the impure dielectric layer 36 and the semiconductor substrate 24. The compound dielectric layer 30 is consisted of the dielectric layer 38 and the impure dielectric layer 36. Interchanging forming a plurality of dielectric layers 38 and a plurality of compound dielectric layers 36 on the compound dielectric layer 30 that had formed, as shown in FIG. 2a.

The impure dielectric layer 36 is formed by UHVCVD (Ultra High Vacuum Chemical Vapor Deposition) with three kinds of gases—O$_2$, SiH$_4$ and GeH$_4$, according to the chemical formula (2):

   (2)

The oxidizing capability of the major elements is stronger than that of the impurities, i.e. the oxidizing capability of Si atoms is stronger than that of Ge atoms to produce a quantum structure as the following treating step.

Figure 2B:
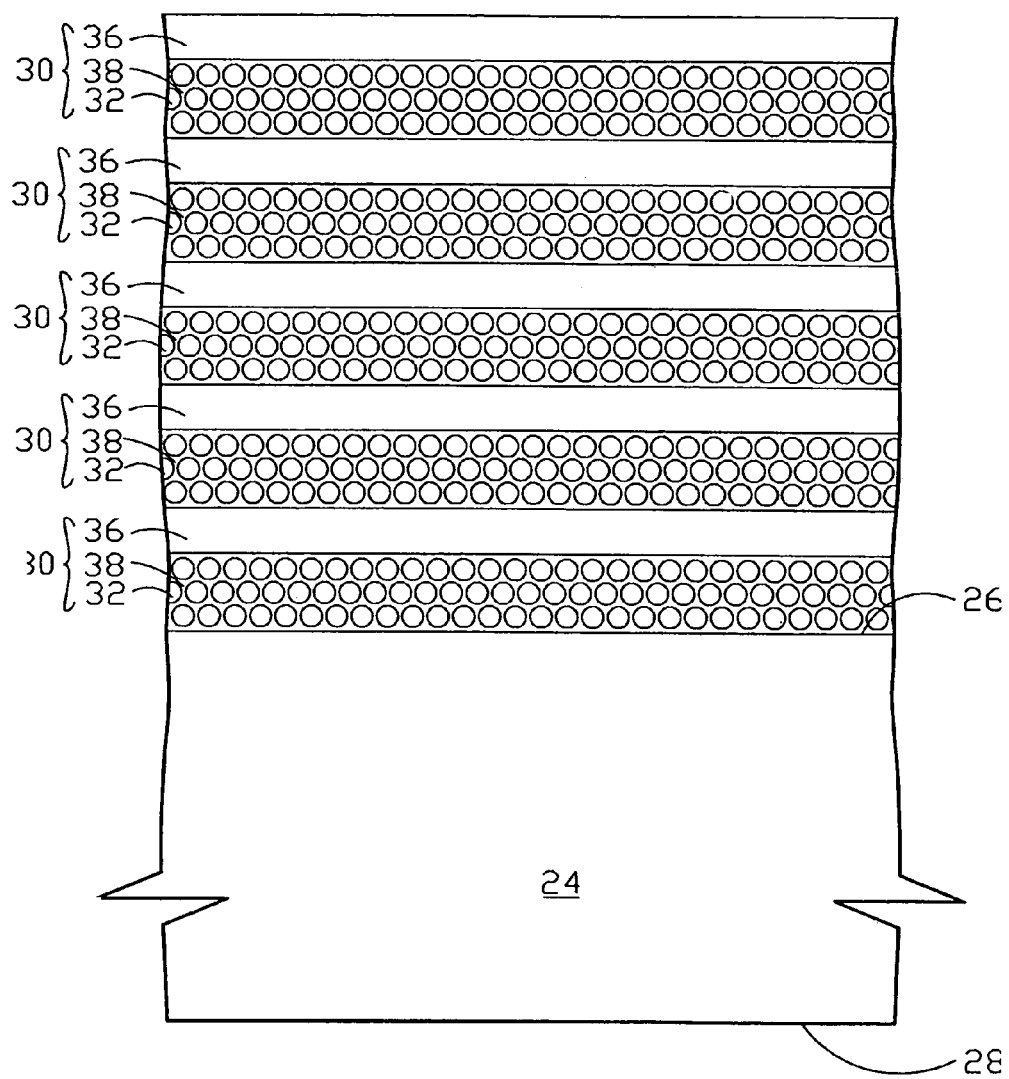

Treating the impure dielectric layer 36 —SiGeO$_2$ layer in an environment without oxygen, to oxidize the Si atoms with the oxygen atoms of the SiGeO$_2$ layer. Then, thermal annealing the compound dielectric layer 30 to drive the Ge atoms of the impure dielectric layer 38 in the dielectric layer 38 to form the quantum structure, as shown in FIG. 2b, wherein the light emitting layer is formed. The Ge atoms are drove into the dielectric layer 38 to form the quantum atoms, because overwhelming majority of the Si atoms (major elements) oxidizing with the oxygen atoms of the impure dielectric layer 36 but overwhelming majority of the Ge atoms (impurities), that having weaker oxidizing capability, non-oxidizing.

Similarly, forming an up electrode on the last formed compound dielectric layer 30, and a down electrode on the down surface 28 of the semiconductor substrate 24 to be a whole light emitting component.

Each compound dielectric layer 30 was constructed by a dielectric layer 38 and a impure dielectric layer 36 before forming the quantum dots 32, and is constructed by the dielectric layer 38, the impure dielectric layer 36 and quantum dots 32 after forming the quantum dots 32. Every quantum dot 32, which is formed by Ge. The whole light emitting component is constructed by the SiO$_2$ layer, the quantum dots 32, that are formed in compound dielectric layers 30, the up electrode and the down electrode.

Because every quantum dot 32 is within the nanometer (nm) scale in dimension, approximately between 1 nm and 20 nm, the density of state of each quantum dot 32 changes as well as changing in dimension of the quantum dot 32 due to the Quantum Confinement Effects. Changing the quantum dot 32 in dimension controls the qualities, e.g. light quality, electric quality and the magnetic quality, of the quantum dot 32. For example, density of state of the quantum dots 32 reduces and separates as well as the quantum dots 32 becomes smaller in dimension, so that the energy gap increases to shorten the wavelength of the emitted light. In one word, the dimension of the quantum dots 32 decides the wavelength of the emitted light. The distribution of density of the quantum dots 32 of the compound dielectric layer 32 decides the intensity of the emitted light. The higher distribution of density of the quantum dots 32 of the compound dielectric layer 32, the higher luminous intensity of emitted light is. Of course, controlling the amount of the impurities in the impure dielectric layer 36 to control the quantum dots 32 in dimension and the distribution of density of the quantum dots 32 is a way for procuring different purposes. As discussed above, the present invention provides a simple forming method of forming a light emitting layer with a quantum structure by original devices without buying or using any new devices according to the difference in characteristic, e.g. the oxidizing capability, between the major elements and impurities. Particularly, the SiGe quantum dots 32 can be produced by reducing the amount of $O_2$ of the impure dielectric layer 36 to limit some Si atoms to oxidize with the un-sufficient oxygen atoms. For example, if the impure dielectric layer 38 is a $SiGeO_x$ layer, where the x<2, portions of Si atoms can not be oxidized to be the $SiO_2$ during the oxidizing process, and these Si atoms and some Ge atoms will be drive to be the SiGe quantum dots 32 together.

The configuration and the distribution of the quantum structure are not limited by the described preferred embodiments. The configuration of the quantum structure is a plurality of quantum dots 32 and the distribution is a single layer. For example, the configuration and the distribution will change, i.e. the distribution of the single-layer quantum dots 32 will change to be the multiple-layer quantum dots 32, as shown in the FIG. 2b, according to some purposes and factors, e.g. different configuration or different composition of the quantum structure.

The preferring embodiments in the present invention provides a light emitting layer with a quantum structure to decide the wavelength of the emitted light by deciding the quantum dots 32 in dimension, and decide the intensity of the light by deciding the density of the quantum structure. The light emitting layer in the present invention also emits light efficaciously, because the electrons and holes, that exist during the 3D energy barrier in the quantum dots 32, recombine to each other easily. Another advantage of the light emitting layer in the present invention is the lower operating voltage.

Besides, the present invention provides a forming method and a structure of a light emitting layer that is formed by original devices without buying or using any new devices, and is formed by plain steps.

The quantum structure of the above described is a plurality of quantum dots, that are formed due to the difference in the oxidizing capability between the Si atoms and Ge atoms. The above description only to demonstrate and illustrate the preferred embodiments of the present invention, not to limit the scope of the present invention to what described detailed herein; and any equivalent variations and modifications in the present invention should be within the scope of the claims hereafter.

The invention claimed is:

1. A light emitting layer, comprising:
   a dielectric layer, said dielectric layer including a quantum structure that are formed from an oxidizing process and said dielectric layer includes a plurality of major elements and a plurality of impurities, and the oxidizing capability of said major elements is stronger than that of said impurities.

2. The light emitting layer according to claim 1, wherein said quantum structure is approximately between 1–20 nm in dimension.

3. The light emitting layer according to claim 1, wherein said quantum structure is a plurality of quantum dots.

4. The light emitting layer according to claim 1, wherein said major elements are silicon atoms or the material that consists of the chemical compound of silicon atoms.

5. The light emitting layer according to claim 1, wherein said impurities are germanium atoms.

6. The light emitting layer according to claim 4, wherein said impurities are germanium atoms.

7. The light emitting layer according to claim 1, wherein said oxidizing process comprises oxidizing said major elements in an environment that is full of oxygen to drive said impurities to form said quantum structure in said dielectric layer.

8. The light emitting layer according to claim 1, wherein said oxidizing process comprises oxidizing said major elements in an environment without oxygen to drive said impurities to form said quantum structure in said dielectric layer.

* * * * *